(12) United States Patent
Sennoun et al.

(10) Patent No.: US 10,277,234 B2
(45) Date of Patent: Apr. 30, 2019

(54) METHOD FOR DEFINING AND APPLYING A FREQUENCY PLAN

(71) Applicant: SAGEMCOM ENERGY & TELECOM SAS, Rueil Malmaison (FR)

(72) Inventors: Yassir Sennoun, Rueil Malmaison (FR); Franck Harnay, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 37 days.

(21) Appl. No.: 15/602,814

(22) Filed: May 23, 2017

(65) Prior Publication Data
US 2017/0366194 A1    Dec. 21, 2017

(30) Foreign Application Priority Data

Jun. 15, 2016   (FR) .................................. 16 55553

(51) Int. Cl.
*H04W 40/00*    (2009.01)
*H03L 7/197*    (2006.01)
(Continued)

(52) U.S. Cl.
CPC .......... *H03L 7/1974* (2013.01); *H03D 7/163* (2013.01); *H04B 1/403* (2013.01); *H04W 4/06* (2013.01); *H04W 16/18* (2013.01); *H04W 52/0235* (2013.01); *H04W 52/0254* (2013.01); *H04W 72/048* (2013.01); *H04W 72/0453* (2013.01); *H04W 84/04* (2013.01); *Y02D 70/00* (2018.01); *Y02D 70/1262* (2018.01)

(58) Field of Classification Search
USPC .................................................. 455/446–454
See application file for complete search history.

(56) References Cited

U.S. PATENT DOCUMENTS 6,744,743 B2 *   6/2004   Walton .................. H04W 52/24
                                                        370/318
7,298,327 B2 *   11/2007   Dupray .................... G01S 1/026
                                                        342/451
(Continued)

OTHER PUBLICATIONS

Feb. 16, 2017 Search Report issued in French Patent Application No. 1655553.
(Continued)

*Primary Examiner* — Edward F Urban
*Assistant Examiner* — Rui M Hu
(74) *Attorney, Agent, or Firm* — Oliff PLC; R. Brian Drozd

(57) ABSTRACT

In a communication system of the LPWAN type including a server and a plurality of gateways intended to make wireless communications with terminals in said communication system, the server: obtains a description of a mobility hierarchy in which mobility types are hierarchically defined; obtains a description of a mobility tree in which mobility areas are hierarchically defined, in conformity with the mobility hierarchy; obtains terrain measurements associated with each mobility area defined in the mobility tree; establishes a frequency plan on the basis of the mobility tree and terrain measurements; and configures the gateways and the terminals according to the frequency plan established.

12 Claims, 6 Drawing Sheets

(51) Int. Cl.
*H03D 7/16* (2006.01)
*H04B 1/403* (2015.01)
*H04W 4/06* (2009.01)
*H04W 16/18* (2009.01)
*H04W 52/02* (2009.01)
*H04W 72/04* (2009.01)
*H04W 84/04* (2009.01)

(56) References Cited

U.S. PATENT DOCUMENTS

| | | | | |
|---|---|---|---|---|
| 8,320,948 B2* | 11/2012 | Li | ............... | H04L 5/0062 455/454 |
| 8,731,567 B2* | 5/2014 | Zhang | ............... | H04W 16/14 370/336 |
| 8,755,829 B2* | 6/2014 | Sun | ............... | H04W 24/10 455/452.1 |
| 2002/0022479 A1* | 2/2002 | Jensen | ............... | H04W 16/18 455/423 |
| 2006/0276201 A1* | 12/2006 | Dupray | ............... | G01S 5/0257 455/456.1 |
| 2012/0040683 A1* | 2/2012 | Shan | ............... | H04W 16/14 455/450 |
| 2013/0210435 A1* | 8/2013 | Dimou | ............... | H04W 36/0085 455/436 |

OTHER PUBLICATIONS

LoRa Alliance et al; LoRaWAN™: What Is It? A technical overview of LoRa® and LoRaWAN™; May 31, 2016; XP055326494; Retreieved from http://www.semtech.com/wireless-rf-iot/LoRaWAN10_final.pdf on Dec. 6, 2016.

Patavina Technologies; "LoRa PT System Architecture;" Patavina Technologies General Document; Document ID: lorapt_system_architecture; Jan. 28, 2016; XP055329352; retreived from http://www.patavinatech.com/pt/wp-content/uploads/LoRaPTSystemArchitecture.pdf on Dec. 15, 2016.

* cited by examiner

METHOD FOR DEFINING AND APPLYING A FREQUENCY PLAN

The present invention relates to a definition and an application of a frequency plan in a communication system of the LPWAN type.

The Internet of Things is emerging. The Internet of Things represents the extension of the internet to things and to places in the physical world. Whereas the internet is not normally extended beyond the electronic world, the Internet of Things represents exchanges of information and data coming from devices present in the real world to the internet, such as for example to make a collection of readings of electricity consumptions or water consumptions, or collections of measurements from sensors in general. The Internet of Things is considered to be the third evolution of the internet, referred to as WEB 3.0. The Internet of Things has a universal character for designating objects connected to various usages, for example in the industrial, food, e-health or home automation field In the context of the Internet of Things, gateways situated on geographically high points are used on behalf of a service operator, in order to create a network infrastructure to enable communicating objects to communicate. Apart from maintenance operations, these gateways are typically fixed and permanent. The SigFox (registered trade mark) or ThingPark (registered trade mark) networks can for example be cited. These gateways communicate with the communicating objects by means of medium- or long-range wireless communication systems of the LPWAN type, such as for example the LoRaWAN technology (registered trade mark, "Long Range Wide-Area Network"), also known by the abbreviation "LoRa" (registered trade mark, "Long Range") from the name of the alliance promoting LoRaWAN (registered trade mark) long-range wide-area network technologies. These gateways thus serve as relays between the communicating objects and a server (the core network), referred to as LNS (standing for "LoRa NetServer" according to the terminology of LoRaWAN technology), configured to process information sent back by the communicating objects and to send commands to said communicating objects.

Such commands sent by the server to said communicating object relate for example to adjustments in transmission rate via a spread factor (SF) and/or adjustments to the transmission power level (TxPower), which therefore makes it possible to apply adaptive (data) rate (ADR) policies. These commands may also make it possible to configure said communicating objects vis-à-vis a frequency plan to be applied to the wireless communications of the network infrastructure.

In such medium- or long-range wireless communication systems of the LPWAN type, it is desirable to define a frequency plan, that is to say to define which frequency bands must be used by such and such equipment in said systems, so as to limit interference during wireless communications made in said systems. This makes it possible in particular to effectively manage the mobility of terminals in said systems. Unlike cell networks (2G, 3G, LTE), the principle of cells and transfer between cells ("handover"), making it possible to change cell without interruption of communications (voice, data), does not exist in medium- or long-range wireless communications systems of the LPWAN type. It is therefore desirable to provide a solution that makes it possible to define and apply effectively, and automatically, a frequency plan in such medium- or long-range wireless communication systems of the LPWAN type.

It is also desirable to provide effective mobility of the terminals in such medium- or long-range wireless communication systems of the LPWAN type.

To do this, the invention relates to a method for defining and applying a frequency plan in a communication system of the LPWAN type comprising a server and a plurality of gateways connected to said server, the plurality of gateways using frequency bands for making wireless communications with terminals in the communication system. The method is such that the server performs the following steps: obtaining a description of a mobility hierarchy in which mobility types are hierarchically defined; obtaining a description of a mobility tree in which the mobility areas are hierarchically defined, each mobility area having a mobility type in conformity with the mobility hierarchy; obtaining terrain measurements associated with each mobility area defined in the mobility tree; determining, from the terrain measurements, for each mobility area, information on the percentage of time during which the terrain measurements show a received signal level RSSI lower than such and such a received signal level RSSI threshold from a predefined set of received signal level RSSI thresholds. In addition, the method is such that the server runs through the mobility tree by iterating the following steps: selecting the mobility area with the highest hierarchical degree not yet processed; determining, for the mobility area selected, a mean probability $P_m$ for each frequency band, from said time-percentage information determined for each mobility area that is a leaf of the tree and is hierarchically attached to the mobility area selected; allocating, for the mobility area detected, up to a quantity P of frequency bands having the best mean probabilities. In addition, the server performs the following steps for configuring the gateways vis-à-vis the frequency plan: obtaining descriptions of mobility ranges in which groupings of mobility areas are made and in which, for each grouping, a list of gateways is associated with each grouping in order to indicate which gateways are intended to support said grouping; configuring each gateway according to said descriptions of ranges and frequency bands allocated to the mobility areas constituting said groupings. In addition, on reception from a terminal of a request for connection to the communication system, the server obtains a description of the terminal from a terminal identifier included in said request, the description including a list of mobility types to which said terminal has a right of access, and the server iterates the following steps for all the mobility types to which said terminal has a right of access: identifying the mobility type with the highest hierarchical degree; identifying which mobility areas correspond to said mobility type with the highest hierarchical degree identified; selecting a mobility area from the mobility areas identified; and allocating to said terminal at least one frequency band allocated to the mobility area selected. Finally, the method is such that the server configures said terminal according to the frequency bands thus allocated to said terminal. Thus it is possible to define and apply effectively, and automatically, a frequency plan in a communication system of the LPWAN type, as well as providing effective mobility of the terminals in such a communication system of the LPWAN type.

According to a particular embodiment, the mean probability $P_m$ is calculated as follows:

$$P_m = \frac{\sum_{k=1}^{N} \sum_{j=RSSI_d}^{RSSI_f} T_k(i,j)}{N * (RSSI_f - RSSI_d)}$$

where $RSSI_d$, is an index value corresponding to the minimum received signal level RSSI threshold value for which a probability value has been expressed vis-à-vis the mobility area in question, $RSSI_f$ is an index value corresponding to the maximum received signal level RSSI threshold value for which a probability value has been expressed vis-à-vis the mobility area in question, N is the quantity of mobility areas considered for calculating the mean probability $P_m$, and $T_k(i,j)$ represents the probability associated with the frequency band in question for the $k^{th}$ mobility area among said N mobility areas for a received signal level RSSI threshold represented by an index value j.

According to a particular embodiment, in order to configure said terminal, the server performs the following steps: informing a first lot of frequency bands allocated to the terminal, via a message responding to the request received; and informing a second lot of frequency bands allocated to the terminal, via one or more supplementary messages.

According to a particular embodiment, channels form groupings of consecutive frequency bands, and the server allocates the frequency bands on a channel base.

According to a particular embodiment, the server obtains the description of the mobility hierarchy, the description of the mobility tree, the terrain measurements and the description of each terminal from another server external to the communication system.

According to a particular embodiment, the server checks that the mobility type of each mobility area of the mobility tree has a hierarchical degree lower than the mobility type of another mobility area to which said mobility area is directly attached in the mobility tree.

According to a particular embodiment, the description of each terminal comprises information indicating whether the terminal is supposed to be fixed, and the server performs the following steps vis-à-vis the terminal that sent the request received: determining the list of frequency bands eligible for said terminal; determining the frequency bands in this list that were allocated to at least three gateways from the gateways that relayed said request; and allocating the frequency bands thus determined to said EP terminal.

According to a particular embodiment, for the frequencies not selected in the list of eligible frequency bands, the server waits until it receives other frames coming from said terminal in order to determine whether new gateways have relayed said other frames and thus determine whether other frequency bands in said list of eligible frequency bands have been allocated to at least three gateways from the gateways that relayed said frames.

According to a particular embodiment, in the case where the quantity of gateways receiving uplink frames coming from said terminal remains strictly less than three, the server sends an alert.

The invention also relates to a server configured so as to define and apply a frequency plan in a communication system of the LPWAN type comprising, apart from said server, a plurality of gateways connected to said server, the plurality of gateways using frequency bands for effecting wireless communications with terminals in the communication system. The server is configured to: obtain a description of a mobility hierarchy in which mobility types are hierarchically defined; obtain a description of a mobility tree in which mobility areas are hierarchically defined, each mobility area having a mobility type in conformity with the mobility hierarchy; obtain terrain measurements associated with each mobility area defined in the mobility tree; determine, from the terrain measurements, for each mobility area, information on the percentage of time during which the terrain measurements show a received signal level RSSI lower than such and such a received signal level RSSI threshold from a predefined set of received signal level RSSI thresholds. In addition, the server is configured so as to run though the mobility tree by iterating the following steps: selecting the mobility area with the highest hierarchical degree not yet processed; determining, for the mobility area selected, a mean probability $P_m$ for each frequency band, from said time-percentage information determined for each mobility area that is a leaf of the tree and is hierarchically attached to the mobility area selected; allocating, for the mobility area selected, up to a quantity P of frequency bands having the best mean probabilities. In addition, the server is configured so as to perform the following steps for configuring the gateways vis-à-vis the frequency plan: obtaining descriptions of mobility ranges in which groupings of mobility areas are made and in which, for each grouping, a list of gateways is associated with each grouping in order to indicate which gateways are intended to support said grouping; configuring each gateway according to said descriptions of ranges and frequency bands allocated to the mobility areas constituting said groupings. In addition, on reception from a terminal of a request for connection to the communication system, the server is configured to obtain a description of the terminal from a terminal identifier included in said request, the description including a list of mobility types to which said terminal has a right of access, and to iterate the following steps for all the mobility types to which said terminal has a right of access: identifying the mobility type with the highest hierarchical degree; identifying which mobility areas correspond to said mobility type with the highest hierarchical degree identified; selecting a mobility area from the mobility areas identified; and allocating to said terminal at least one frequency band allocated to the mobility area selected. Finally, the server is configured to configure said terminal according to the frequency bands thus allocated to said terminal.

The invention also relates to a computer program, which can be stored on a medium and/or downloaded from a communication network, in order to be read by a processor. This computer program comprises instructions for implementing the method mentioned above, when said program is executed by the processor. The invention also relates to an information storage medium storing such a computer program.

The features of the invention mentioned above, as well as others, will emerge more clearly from a reading of the following description of an example embodiment, said description being given in relation to the accompanying drawings, among which:

Figure 8:
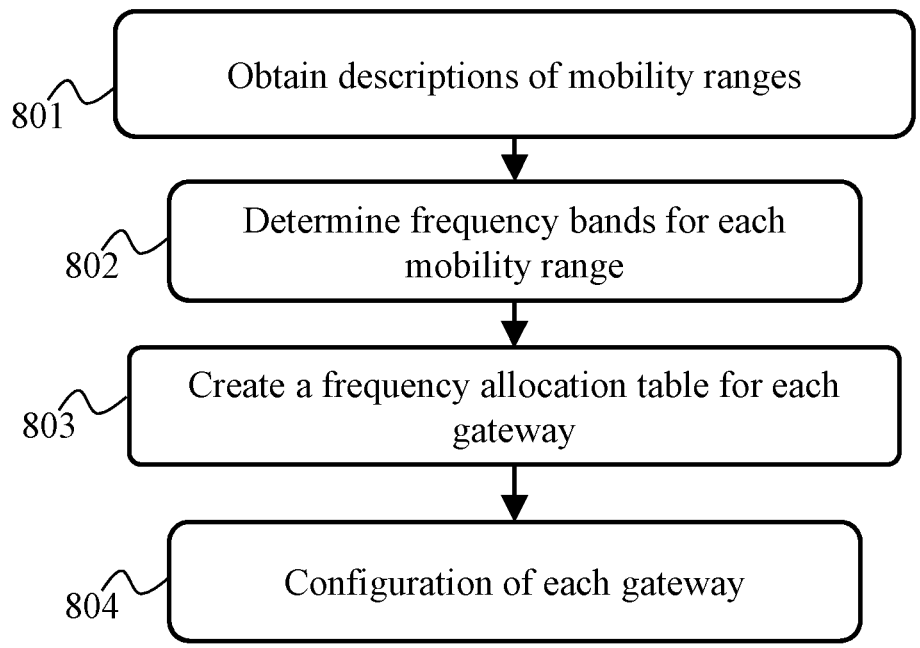
Figure 9:
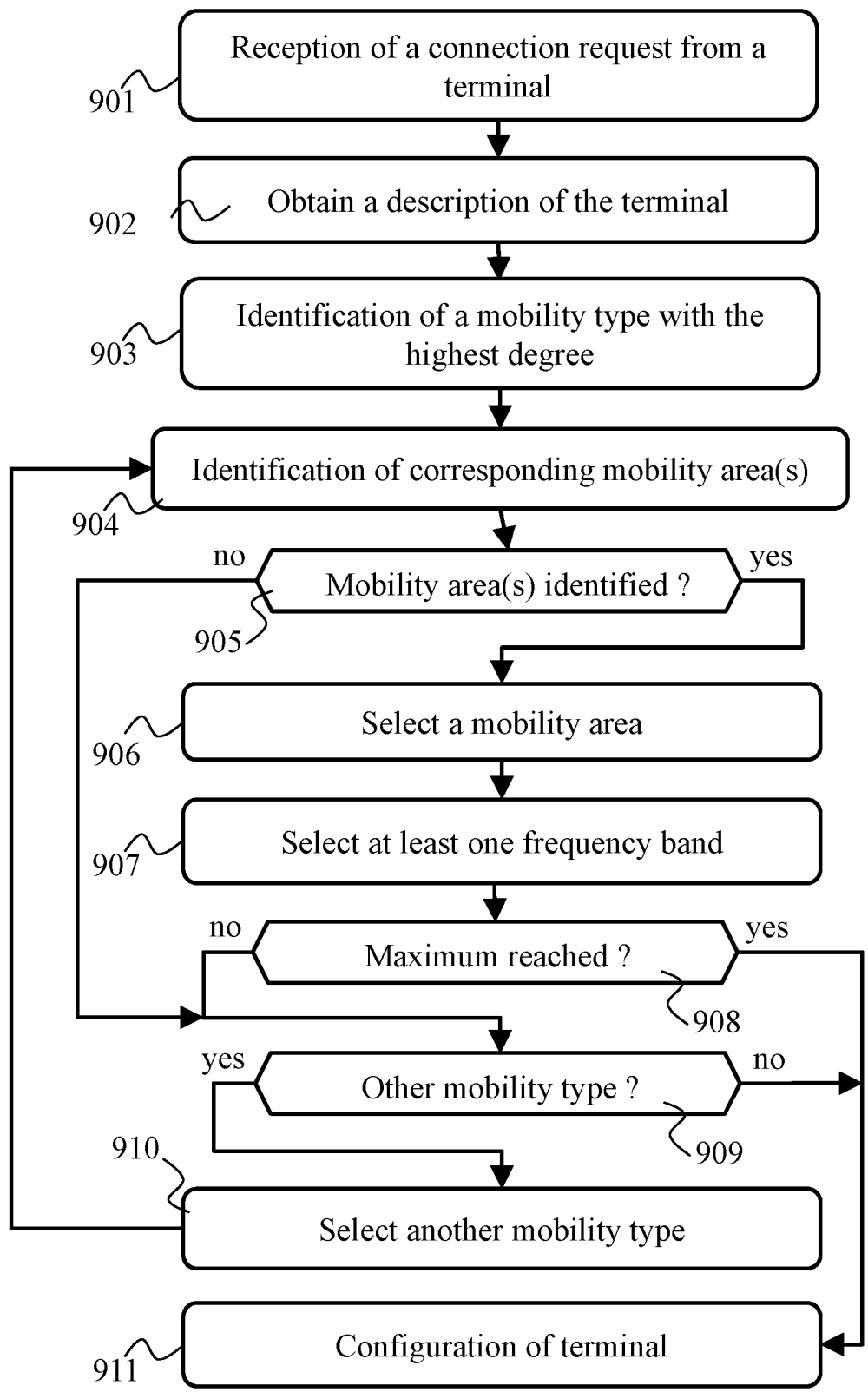

FIG. 8 illustrates schematically an algorithm, implemented by said server of the communication system, for configuring gateways of the communication system in order to apply the frequency plan defined for the communication system; and FIG. 9 illustrates schematically an algorithm, implemented by said server of the communication system, for configuring terminals of the communication system in order to apply the frequency plan defined for the communication system.

The invention is more particularly described below in a context of a network infrastructure of the LoRaWAN (registered trade mark) type, using in particular terminologies that are found in the LoRaWAN (registered trade mark) specifications. The principles and implementations described below do however apply, more generally, to a context of a network infrastructure of the LPWAN type.

Figure 1:
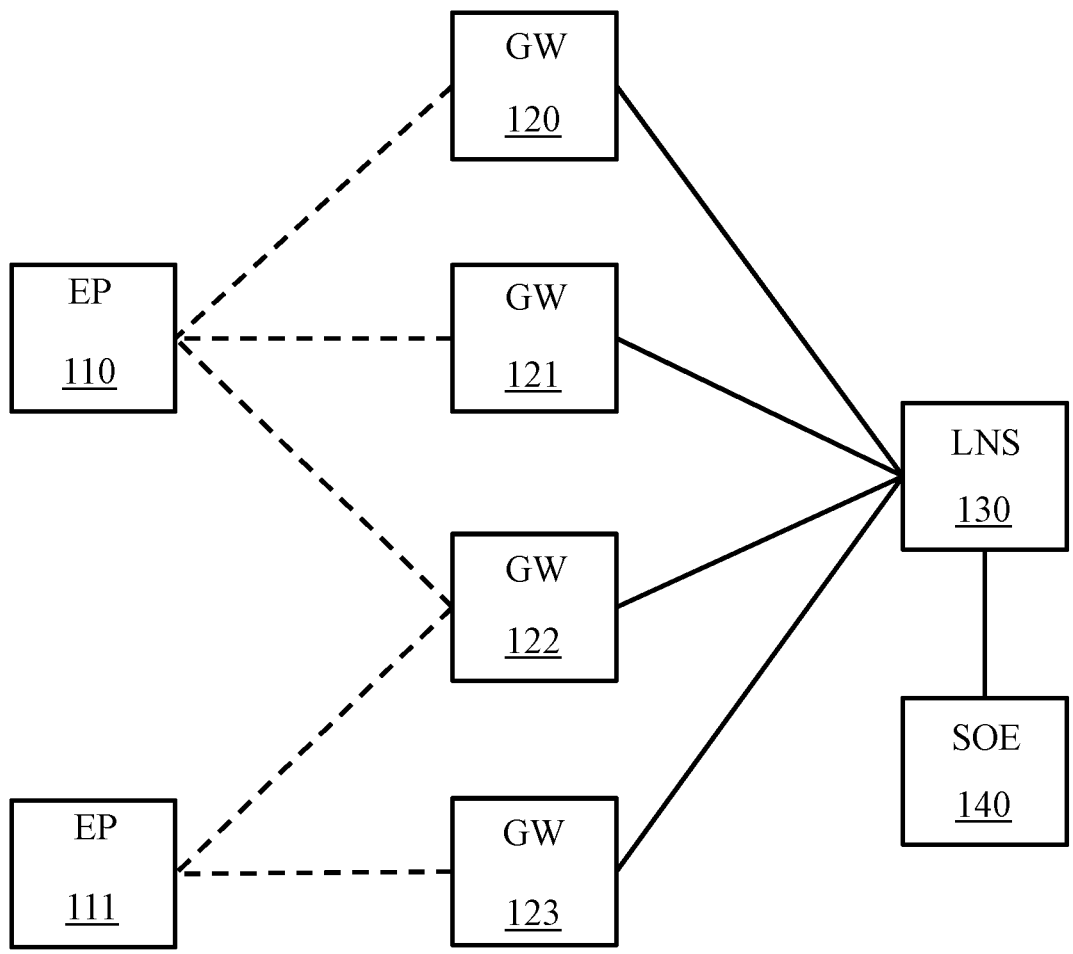
FIG. 1 illustrates schematically a communication system in which the present invention can be implemented.

FIG. 1 illustrates schematically a communication system in which the present invention can be implemented.

The communication system comprises a plurality of GW gateways 120, 121, 122, 123. The GW gateways 120, 121, 122, 123 have available respective communication links with an LNS server 130 to which said GW gateways are attached. According to a particular embodiment each GW gateway 120, 121, 122, 123 includes a function for accessing the internet, and the communication link between said residential gateway and the LNS server 130 is based on the IP protocol (internet protocol, as defined in the standard document RFC 791).

In the communication system, messages must be sent back to the LNS server 130 in the form of frames from each EP (end point) terminal device 110, 111 in a set of terminal devices of said communication system. Said LNS server 130 has a role of checking and collecting information available from EP terminal devices 110, 111, and the GW gateways 120, 121, 122, 123 have a role of relay between the EP terminal devices 110, 111 and the LNS server 130. Messages, in particular command messages, can also be transmitted in the form of frames from the LNS server 130 to the EP terminal devices 110, 111 via the GW collection gateways 120, 121, 122, 123. Such commands sent by the LNS server 130 to said EP terminal devices 110, 111 make it possible more particularly, in the context of the present invention, to configure the EP terminal devices 110, 111 vis-à-vis a frequency plan to be applied to the wireless communications in the communication system.

To make it possible to fulfil this role of relay, each GW gateway 120, 121, 122, 123 has at least one radio interface enabling said collection gateway to communicate with at least one EP terminal device 110, 111 by relying on a wireless communication network, preferentially according to a communication technology of the LPWAN type. Said radio interface is for example of the LoRa (registered trade mark) type thus making it possible to implement, in the communication system, a data transmission protocol of the LoRaWAN type (registered trade mark). Said radio interface is such that an EP terminal device can be within communication range by radio with a plurality of GW gateways, depending on the geographical position of said EP terminal device with respect to the GW gateways 120, 121, 122, 123 and the radio transmission conditions in the environment of said EP terminal device and the GW gateways 120, 121, 122, 123. This is the case for example with the EP terminal device 110 in FIG. 1, which is within radio communication range of the GW gateways 120, 121 and 122. The EP terminal device 111 in FIG. 1 is for its part within radio communication range of the GW gateways 122 and 123.

The communication system is preferentially connected, via the LNS server 130, to an SOE (Service Operator Equipment) server 140, to enable the LNS server 130 to obtain information and descriptions from the service operator to whom the communication system has been made available. The communications between the LNS server 130 and the SOE server 140 rely on a communication protocol suitable for enabling the LNS server 130 to obtain said information and said descriptions, such as for example the TCP protocol (Transmission Control Protocol), as defined in the standard document RFC 793). In a variant embodiment, the LNS server 130 is configured to obtain said information and said descriptions via a man-machine interface implemented by said LNS server 130.

Figure 2:
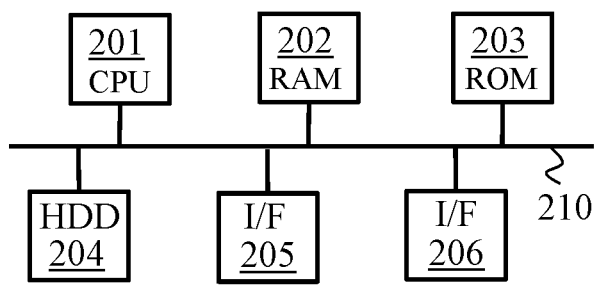
FIG. 2 illustrates schematically an example of hardware architecture of a communication device of the communication system of FIG. 1.

FIG. 2 illustrates schematically an example of hardware architecture of a communication device of the communication system of FIG. 1. Each EP terminal device 110, 111 and/or each GW gateway 120, 121, 122, 123 and/or the LNS server 130 and/or the SOE server 140 can be constructed on the basis of such hardware architecture.

The communication device comprises, connected by a communication bus 210: a processor or CPU (Central Processing Unit) 201; a random access memory (RAM) 202; a read only memory (ROM) 203; a storage unit or a storage medium reader, such as an SD (Secure Digital) card reader or a hard disk HDD (Hard Disk Drive) 204; an I/F communication interface 205, and optionally another I/F communication interface 206.

When the communication device in FIG. 2 represents an EP terminal device of the communication system, the I/F communication interface 205 is configured so as to enable said EP terminal device to communicate with one or more GW gateways of the communication system.

When the communication device in FIG. 2 represents a GW gateway of the communication system, the I/F communication interface 205 is configured so as to enable said GW gateway to communicate with EP terminal devices of the communication system, and the other I/F communication interface 206 is configured so as to enable said GW gateway to communicate with the LNS server 130.

When the communication device in FIG. 2 represents the LNS server 130, the I/F communication interface 205 is configured so as to enable said LNS server 130 to communicate with the GW gateways of the communication system. In a particular embodiment, the other I/F communication interface 206 is configured so as to enable said LNS server 130 to communicate with the SOE server 140.

When the communication device in FIG. 2 represents the SOE server 140, the I/F communication interface 205 is configured so as to enable said SOE server 140 to communicate with the LNS server 130.

The processor 201 is capable of executing instructions loaded into the RAM 202 from the ROM 203, from an external memory, from a storage medium, or from a communication network. When the communication device is powered up, the processor 201 is capable of reading instructions from the RAM 202 and executing them. These instructions form a computer program causing the implementation, by the processor 201, or all or some of the algorithms and steps described here in relation to the communication device in question.

Thus all or some of the algorithms and steps described here can be implemented in software form by the execution of a set of instructions by a programmable machine, such as a DSP (Digital Signal Processor) or a microcontroller. All or some of the algorithms and steps described here can also be implemented in hardware form by a machine or a dedicated component, such as an FPGA (Field-Programmable Gate Array) or an ASIC (application-specific integrated circuit).

Figure 3:
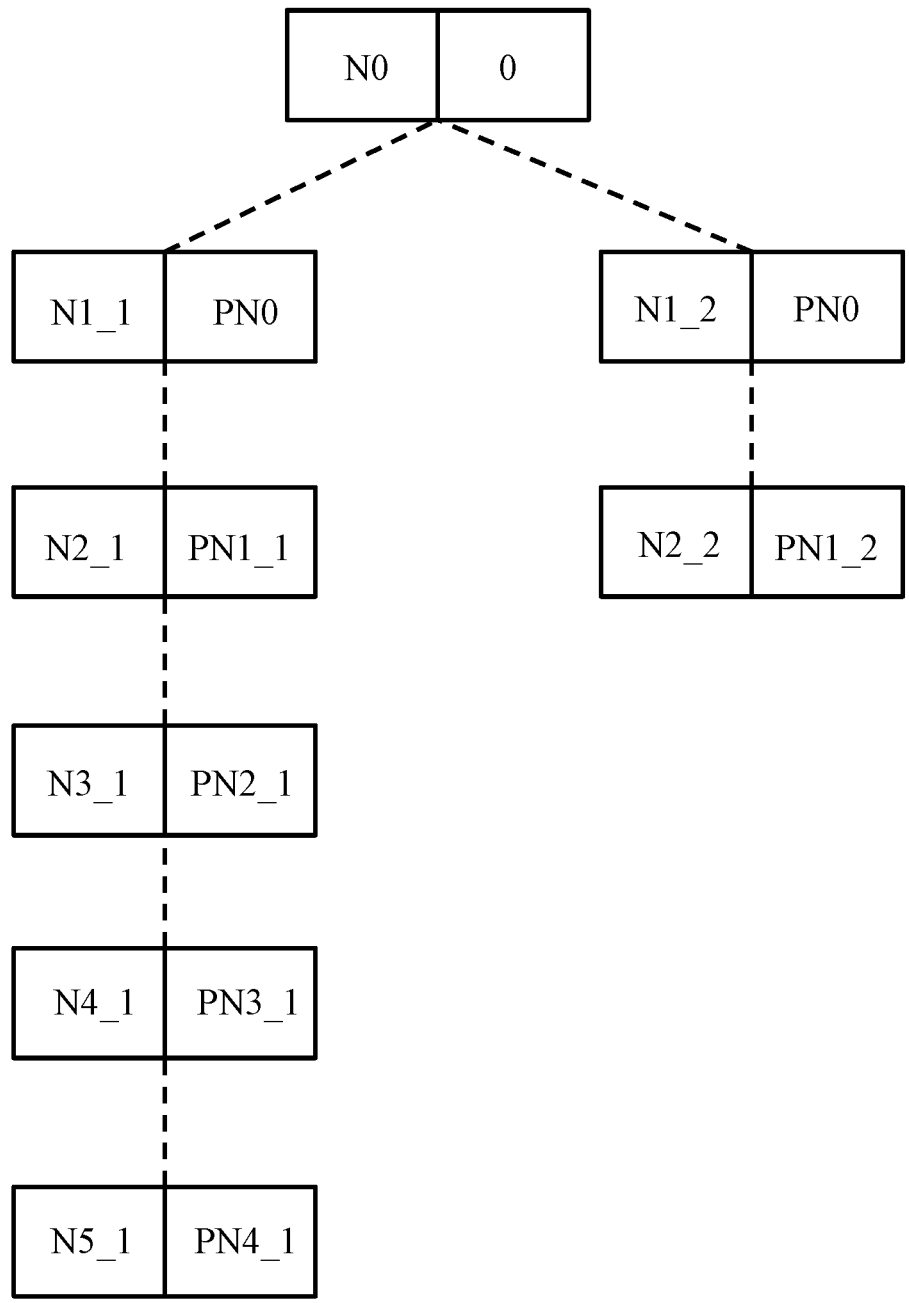
FIG. 3 illustrates schematically an example of mobility hierarchy intended to make it possible to define a frequency plan suited to the communication system vis-à-vis its environment.

FIG. 3 illustrates schematically an example of mobility hierarchy intended to make it possible to define a frequency plan suited to the communication system vis-à-vis its environment.

The LNS server 130 enables the service operator to define a mobility hierarchy consisting of a hierarchical set of mobility types (MobilityType). This definition of the mobility hierarchy is thus supplied by the SOE server 140 to the LNS server 130, or is supplied to the LNS server 130 by means of its man-machine interface. The hierarchical set of mobility types corresponds to the various geographical-mobility types that the EP terminals of the communication system are allowed to have: local, to the size of a town, regional, national, etc., or any other hierarchy of geographical-coverage types. The hierarchical set of mobility types is therefore a set of types of network coverage areas made hierarchical according to the size of their respective network coverages. The naming convention of the mobility types and the interpretation of the hierarchy are the responsibility of the service operator.

The mobility hierarchy is therefore a hierarchical set of mobility types, an example embodiment of which is illustrated by FIG. 3 in the form of a tree of interconnected nodes. The root of the hierarchy is shown at the very top of FIG. 3, and represents the highest hierarchical degree. Each node of the tree comprises at least two elements: a mobility-type name and a pointer to the parent node in the hierarchy. The root corresponds to a mobility type generically labelled N0 in FIG. 3. For example, the type of the root is named "Norm". Since the root does not, by definition, have a parent node, the pointer associated with the root is without signification. For example, this pointer is fixed at a predefined value (e.g. "0") or points to the root itself. Two mobility types, generically labelled N1_1 and N1_2 in FIG. 3, are hierarchically directly attached to the root. For example, the type generically labelled N1_1 is named "Public" and the type generically labelled N1_2 is named "Corporate". The pointers of the mobility types generically labelled N1_1 and N1_2 in FIG. 3 point to the root. Each of them is thus labelled PN0 in FIG. 3. A single mobility type, generically labelled N2_2 in FIG. 3, is hierarchically directly attached to the mobility type generically labelled N1_2 in FIG. 3. For example, the mobility type generically labelled N2_2 in FIG. 3 is named "Postal Service". The pointer of the mobility type generically labelled N2_2 in FIG. 3 points to the mobility type generically labelled N1_2 in FIG. 3, and is thus labelled PN1_2 in FIG. 3. A single mobility type, generically labelled N2_1 in FIG. 3, is hierarchically directly attached to the mobility type generically labelled N1_1 in FIG. 3. For example, the mobility type generically labelled N2_1 in FIG. 3 is named "National". The pointer of the mobility type generically labelled N2_1 in FIG. 3 points to the mobility type generically labelled N1_1 in FIG. 3 and is thus labelled PN1_1 in FIG. 3. A single mobility type, generically labelled N3_1 in FIG. 3, is hierarchically directly attached to the mobility type generically labelled N2_1 in FIG. 3. For example, the mobility type generically labelled N3_1 in FIG. 3 is named "Conurbation". The pointer of the mobility type generically labelled N3_1 in FIG. 3 points to the mobility type generically labelled N2_1 in FIG. 3 and is thus labelled PN2_1 in FIG. 3. A single mobility type, generically labelled N4_1 in FIG. 3, is hierarchically directly attached to the mobility type generically labelled N3_1 in FIG. 3. For example, the mobility type generically labelled N4_1 in FIG. 3 is named "Town". The pointer of the mobility type generically labelled N4_1 in FIG. 3 points to the mobility type generically labelled N3_1 in FIG. 3 and is thus labelled PN3_1 in FIG. 3. Finally, a single mobility type, generically labelled N5_1 in FIG. 3, is hierarchically directly attached to the mobility type generically labelled N4_1 in FIG. 3. For example, the mobility type generically labelled N5_1 in FIG. 3 is named "Premises". The pointer of the mobility type generically labelled N5_1 in FIG. 3 points to the mobility type generically labelled N5_1 in FIG. 3 and is thus labelled PN4_1 in FIG. 3.

Each node of the tree may comprise one or more supplementary elements, such as for example a pointer to each of any of its child nodes in the mobility hierarchy.

In the case where the LNS server 130 must manage a plurality of hierarchies, such a tree is supplied to the LNS server 130 for each of said hierarchies and may thus have different structures, different naming conventions and different interpretations. A hierarchy identifier is then used for distinguishing, with respect to one another, the hierarchies thus defined.

Figure 4:
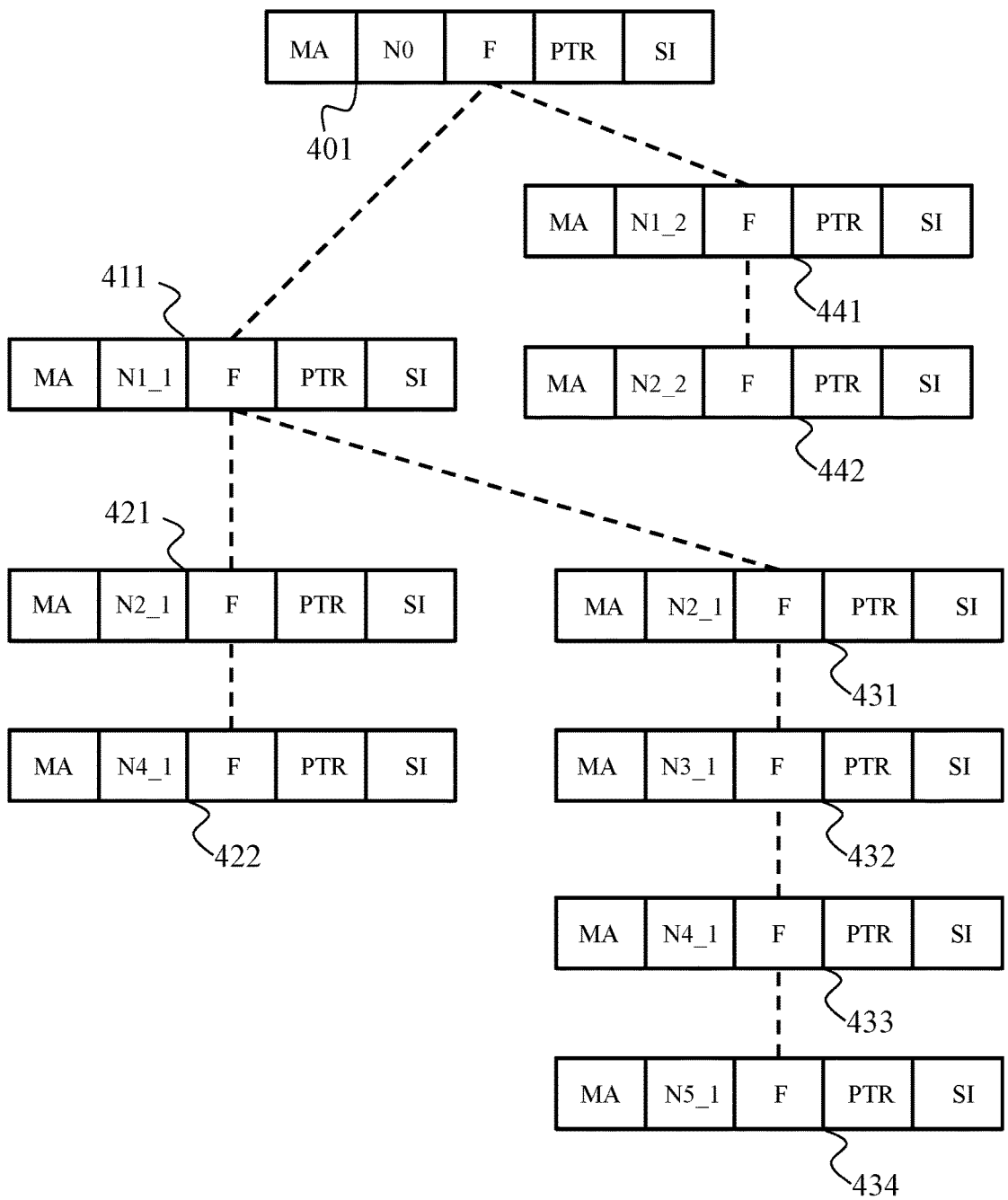
FIG. 4 illustrates schematically an example of a mobility tree in application of the mobility hierarchy of FIG. 3.

FIG. 4 illustrates schematically an example of a mobility tree in application of the mobility hierarchy as previously described in relation to FIG. 3.

A mobility tree is an instance of a mobility hierarchy. This tree corresponds to a description of geographical coverage of the wireless communications of the communication system for a given service, in which each node of the tree is an instance of a mobility type defined in said mobility hierarchy and in which each node of the tree is associated with a mobility area (MobilityArea). Each mobility area is associated with a mobility type (MobilityType) with a hierarchy degree lower than the one associated with its parent node, or parent mobility area. Each node of the tree comprises at least four elements: a mobility-area name MA, the mobility type of said mobility area, a pointer PTR to the parent mobility area, and at least one frequency band F associated with said mobility area. The frequency band or bands F associated with said mobility area are determined as described below in relation to FIGS. 6 to 8.

An example of a mobility tree is shown in FIG. 4, based on the mobility hierarchy example shown in FIG. 3. The mobility tree then comprises a root 401 that is a mobility-type instance "Norm". For example, the root 401 represents a mobility area MA called "LoRa". The mobility tree also comprises two nodes 411 and 441 directly attached to the root 401. The node 411 is an instance of a mobility type "Public" and the second node 441 is an instance of a mobility type "Corporate". For example, the node 411 represents a mobility area MA called "Public", and the node 441 represents a mobility area MA called "Corporate". The mobility tree also comprises two nodes 421 and 431 directly attached to the node 411. The nodes 421 and 431 are instances of a mobility type "National". For example, the node 421 represents a mobility area MA called "Tunisia" and the node 431 represents a mobility area MA called "France". A single node 422 is directly attached to the node 421. The node 422 is an instance of a mobility type "Town". For example, the node 422 represents a mobility area MA called "Tunis". It will therefore be noted that each mobility area is associated with a mobility type (MobilityType) with a hierarchical degree lower than the one associated with its parent mobility area in the mobility tree, without its being necessary for said mobility area to be associated with a mobility type (MobilityType) with a hierarchical degree immediately lower than the one associated with its parent mobility zone in the mobility hierarchy in question. In other words, jumps in hierarchical degree can be made in order to define the mobility tree, with respect to the definition of the mobility hierarchy of which the mobility tree is an instance. A single node 432 is directly attached to the node 431. The node 432 is an instance of a mobility type "Conurbation". For example, the node 432 represents a mobility area MA called "Paris Conurbation". A single node 433 is directly attached to the node 432. The node 433 is an instance of a mobility type "Town". For example, the node 433 represents a mobility area MA called "Rueil". A single node 434 is directly attached to the node 433. The node 434 is an instance of a mobility type "Premises". For example, the node 434 represents a mobility area MA called "Sagemcom". Finally, a single node 442 is directly attached to the node 441. The node 442 is an instance of a mobility type "Postal Service". For example, the node 442 represents a mobility area MA called "Automobile Garages".

Each node in the tree may comprise one or more supplementary elements SI, such as for example a pointer to any of the child nodes that it may have.

In the case where the LNS server 130 must manage a plurality of hierarchies, such a tree is supplied to the LNS server 130 in association with a hierarchy identifier allocated to the mobility hierarchy to which said mobility tree refers. A plurality of mobility trees may be defined as distinct instances of the same mobility hierarchy. A mobility tree identifier is then used for distinguishing, with respect to one another, the mobility trees thus defined.

Figure 5:
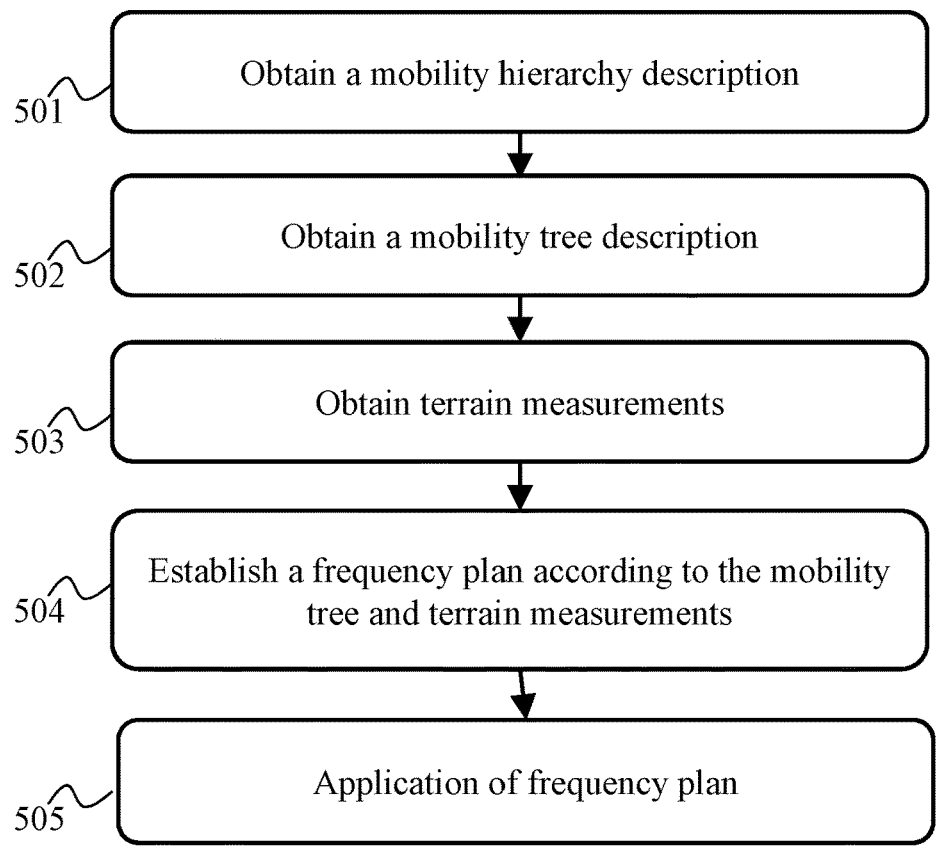
FIG. 5 illustrates schematically an algorithm, implemented by a server of the communication system, for configuration of said communication system so as to apply the frequency plan suited to the communication system vis-à-vis its environment.

FIG. 5 illustrates schematically an algorithm, implemented by the LNS server 130, for configuring the communication system in order to apply a frequency plan suited to the communication system vis-à-vis its environment.

In a step 501, the LNS server 130 obtains a mobility hierarchy description, as presented above in relation to FIG. 3.

In a step 502, the LNS server 130 obtains a description of a mobility tree, as presented above in relation to FIG. 4. Preferentially, the LNS server 130 checks the conformity of the mobility tree vis-à-vis the mobility hierarchy.

In a step 503, the LNS server 130 obtains terrain measurements associated with each mobility area defined in the mobility tree. This aspect is detailed hereinafter in relation to FIG. 6.

In a step 504, the LNS server 130 establishes a frequency plan to be applied in the communication system, using terrain measurements and the mobility tree, in order to improve the communication performance of the communication system vis-à-vis its environment. This aspect is detailed hereinafter in relation to FIG. 7.

In a step 505, the LNS server 130 instructs the GW gateways and the EP terminals of the communication system to apply the frequency plan defined at step 504. This aspect is detailed hereinafter in relation to FIGS. 8 and 9.

Figure 6:
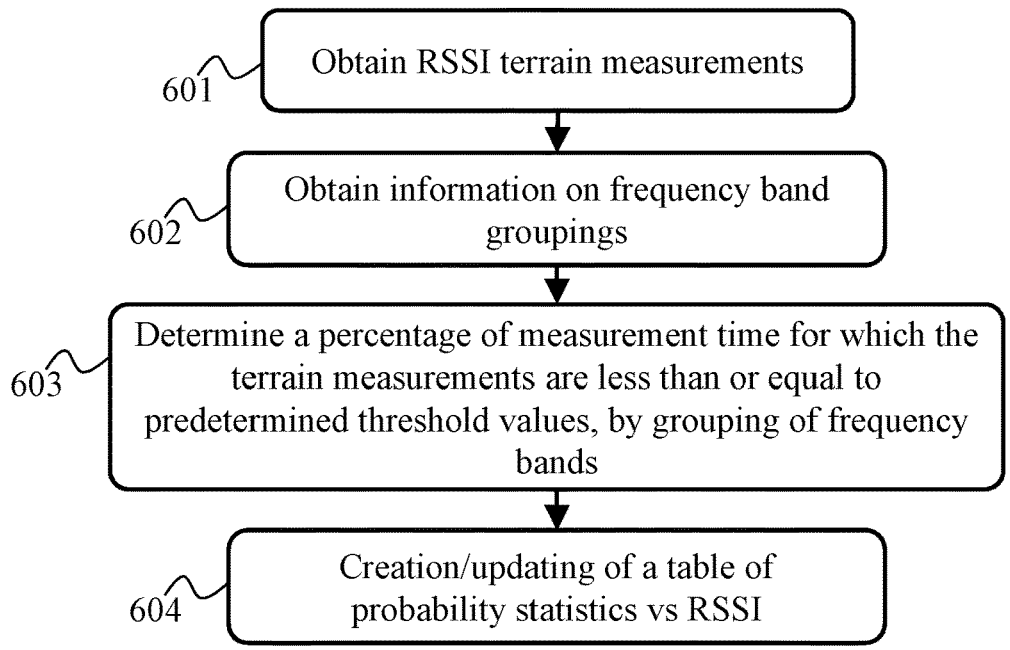
FIG. 6 illustrates schematically an algorithm, implemented by said server of the communication system, for creating a table of statistics of probabilities versus received signal level indicators RSSI, in the context of the definition of the frequency plan suited to the communication system vis-à-vis its environment.

FIG. 6 illustrates schematically an algorithm, implemented by the LNS server 130, for creating a table of statistics of probabilities versus received signal level RSSI indications, in the context of the definition of the frequency plan suited to the communication system vis-à-vis its environment.

In a step 601, the LNS server 130 obtains terrain measurements, for each mobility area (MobilityArea) that is a leaf (a termination point of the tree with respect the root of the tree) in the mobility tree obtained by the LNS server 130 at step 501. The terrain measurements are supplied to the LNS server 130 by the SOE server 140 or by entry via its man-machine interface.

The LNS server 130 manipulates the terrain measurements obtained, so as to obtain, by frequency band or by channel usable for wireless communications between the GW gateways and the EP channels, information on the percentage of time during which the terrain measurements show a received signal level lower than such and such a received signal level RSSI threshold from a predefined set of received signal level RSSI thresholds. This aspect is detailed hereinafter with regard to the rest of the algorithm in FIG. 6.

The terrain measurements are required as follows. The objective is to know, with the best possible precision, the noise present in the various frequency bands in which the communication system is authorised to make communications, in order to be able to determine a frequency plan suited to the communication system vis-à-vis its environment.

The measurement principle consists, for each mobility area concerned, of connecting a radio receiver of the spectrum analyser type to an antenna of a high point of said mobility area and, as time goes by, recording noise samples in the various frequency bands. For example, the communication system is authorised to make communications in frequency bands of 25 kHz between 863 MHz and 870 MHz. the radio receiver records variations in the received level RSSI during a predefined period by frequency band, and proceeds thus successively for all the frequency bands in which the communication system is authorised to make communications. This procedure can be iterated over a plurality of cycles, the measurements acquired then being combined in accordance with a predefined rule (addition, mean, max, min, etc) with those previously acquired. The greater the quantity of cycles effected, the greater the precision on the noise statistically present in the frequency bands in question. The measurements can next be grouped together by communication channel, if such communication channels grouping together a plurality of consecutive frequency bands are defined for making the wireless communications of the communication system. For example, the measurements made are grouped together by communication channels 125 kHz wide, thus each grouping together five consecutive bands of 25 kHz. This grouping can also be made by the LNS server 130, as described below in relation to a step 602.

Thus the measurements made can be presented in the form of a table of measurements having on the Y axis the frequency bands or channels in question and on the X axis predefined received level RSSI (threshold) values. Each cell in the table then contains, for the frequency band or channel corresponding to said cell, information on the time during which the measurements made show a received signal level RSSI lower than or equal to the predefined received level RSSI (threshold) corresponding to said cell. With each line in the table there is associated information on the time T during which the measurements were made for the frequency band or channel corresponding to said line.

In step 602, in order as required to effect groupings of measurements by channel from measurements obtained by frequency band (each channel being a predefined grouping of a plurality of consecutive frequency bands), the LNS server 130 adds together the values contained in the relevant cells of the table of terrain measurements. With each channel there is then associated the sum of the time information T that was previously associated with the frequency bands constituting said channel.

From the measurements made, it is possible to determine, by frequency band or by channel, the percentage of time during which there is statistically no noise higher than a given (threshold) received signal RSSI value. For this purpose, in a step 603, the LNS server 130 determines, for each frequency band or channel in question, the time of the terrain measurements that gave a received signal level RSSI lower than the predefined (threshold) received signal RSSI value in question, vis-à-vis each predefined (threshold) received signal RSSI value. The LNS server 130 next divides this time by the quantity of time units during which the measurements were made for the frequency band or channel in question, which, through the RSSI threshold value, gives the required percentage of time.

In a step 604, the LNS server 130 creates, or updates, a table of statistics of probabilities versus the received signal RSSI level. This table of statistics then contains on the Y axis the frequency bands or channels in question and on the X axis the predefined (threshold) received level RSSI values. Each cell in the table then contains, for the frequency band or channel corresponding to said cell, the information on the percentage of time during which the terrain measurements gave a received signal RSSI level lower than or equal to the predefined (threshold) received signal level RSSI corresponding to said cell. The table of statistics thus created is next used by the LNS server 130, as detailed below in relation to FIG. 7. In an embodiment in a variant, the LNS server 130 receives from the SOE server 140, or via its man-machine interface, directly the table of statistics of probabilities versus the received signal RSSI level.

Figure 7:
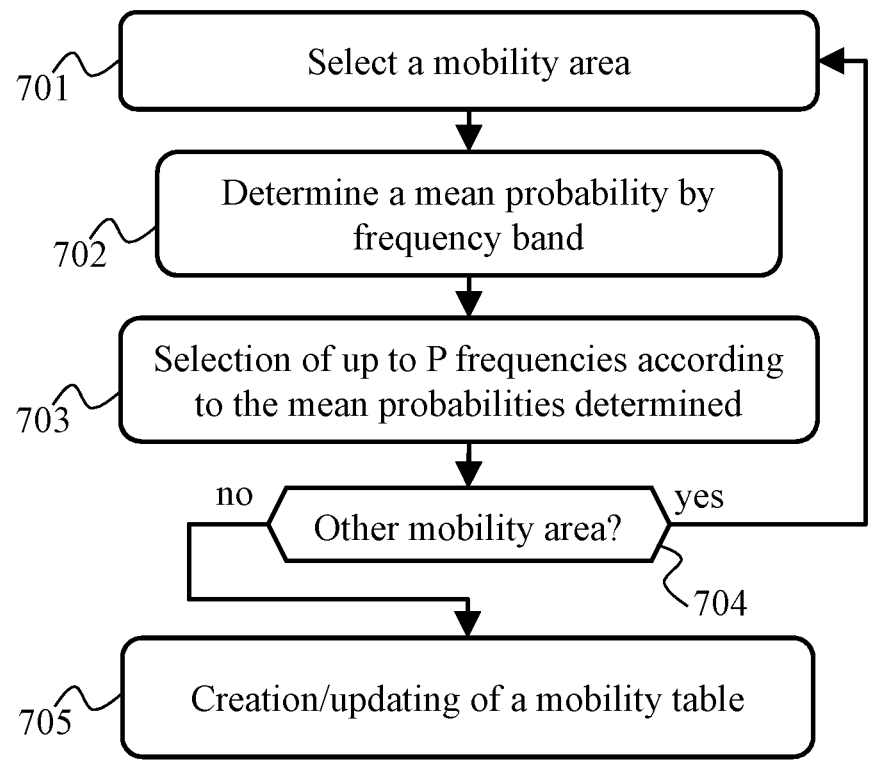
FIG. 7 illustrates schematically an algorithm, implemented by said server of the communication system, for creating a mobility table representing the frequency plan defined for the communication system.

FIG. 7 illustrates schematically an algorithm, implemented by the LNS server 130, for creating a mobility table representing the frequency plan defined for the communication system.

In a step 701, the LNS server 130 selects the mobility area with the highest hierarchical degree not yet processed in the context of the current execution of the algorithm in FIG. 7. When there exist a plurality of mobility areas with the same hierarchical degree that can be selected by the LNS server 130 in step 701, the LNS server 130 applies a predefined rule for selecting one mobility area among the mobility areas with the same hierarchical degree that can be selected by the LNS server 130 in step 701. At the first iteration in a sequence of step 701 in the context of the current execution of the algorithm in FIG. 7, the LNS server 130 selects the root mobility area of the mobility tree.

In a step 702, the LNS server 130 determines, for the mobility area selected at step 701, a mean probability $P_m$ for each frequency band or channel, from the table of statistics (of probabilities versus received signal level RSSI) obtained vis-à-vis each mobility area that is situated between a leaf of the mobility tree and is hierarchically (indirectly or directly) attached to the mobility area selected at step 701. This mean probability $P_m$ represents a probability that there is no noise leading to a given RSSI value on the frequency band or channel in question.

The aforementioned mean probability $P_m$ is calculated as follows:

$$P_m = \frac{\sum_{k=1}^{N} \sum_{j=RSSI_d}^{RSSI_f} T_k(i, j)}{N * (RSSI_f - RSSI_d)}$$

where $RSSI_d$ is an index value corresponding to the minimum RSSI threshold value for which a probability value has been expressed in the probability table in question, $RSSI_f$ is an index value corresponding to the maximum RSSI threshold value for which a probability value has been expressed in the probability table in question, N is the quantity of tables of statistics of probabilities in question for calculating the main probability $P_m$, and $T_k(i,j)$ represents the probability associated with the frequency band in question or the channel in question in the $k^{th}$ table of probabilities (among said tables in question) for an RSSI threshold represented by an index value j.

In a step 703 the LNS server 130 selects up to a predefined quantity P ($P \geq 1$) of frequency bands or channels from the frequency bands or channels that can be used by the communication system for making wireless communications. The frequency bands or channels selected by the LNS server 130 are the frequency bands or channels having the best mean probabilities (the highest values) as calculated at step 702, provided that the frequency bands or channels in question have not already been allocated to the root or to a mobility area that is an intermediary in the mobility tree between the root and the mobility area selected at step 701. If fewer than P frequency bands or channels remain after having removed the frequency bands or channels allocated to the root or to a mobility area that is an intermediary in the mobility tree between the root and the mobility area selected at step 701, then the LNS server 130 selects these frequency bands or channels that remain. If all the frequencies have been selected and there are still mobility areas to be processed, then the LNS server 130 does not by itself allocate frequencies to these mobility areas. It is a case of faulty sizing of the communication system by the service operator. Consequently the LNS server 130 sends an alarm to the SOE server 140 so that the service operator can define in return a policy of allocating frequencies accordingly, such as for example forcing the allocation of the P frequency bands or channels having the best mean probabilities or cancelling the current establishment of the frequency plan. If at least P frequency bands or channels remain after having removed the frequency bands or channels allocated to the root or to a mobility area that is an intermediary in the mobility tree between the root and the mobility area selected at step 701, the LNS server 130 selects the P frequency bands or channels having the best mean probabilities as calculated at step 702. The frequency bands or channels thus selected by the LNS server 130 are then allocated to the mobility area selected at step 701.

The quantity P may be a default parameter of the LNS server 130; the quantity P may in a variant be a parameter supplied by the SOE server 140 to the LNS server 130. It should be noted that the parameter P is potentially different from one mobility area to another.

In a step 704, the LNS server 130 checks whether at least one other mobility area of the mobility tree must be considered. The LNS server 130 is supposed to run through the tree from the root of the tree to each leaf of the tree, until the tree has been entirely run through. If at least one other mobility area must be considered, step 701 is reiterated; otherwise a step 705 is performed.

In step 705, the LNS server 130 creates, or updates, a mobility table associated with the mobility tree in question. The mobility table supplies, for each mobility area of the mobility tree, one or more frequency bands or channels that have thus been allocated to said mobility area. The mobility table may contain supplementary information, such as for example a reminder of the type of mobility characterising the mobility area in question, a reminder of the parent mobility area in the mobility tree, etc.

FIG. 8 illustrates schematically an algorithm, implemented by the LNS server 130, for configuring the GW gateways in order to apply the frequency plan as defined by execution of the algorithm in FIG. 7.

In a step 801, the LNS server 130 obtains descriptions of the mobility ranges that correspond respectively to sets of mobility areas. This is because, in order to cover the most mobility areas possible, each GW gateway preferentially supports a plurality of mobility areas, which is manifested by managing frequency bands or channels allocated to a plurality of mobility areas. To achieve this, the LNS server 130 obtains these mobility ranges from the SOE server 140 or by entry via its man-machine interface.

In order to have coherence with regard to the radio coverage, it is necessary for all the frequency bands (or channels) or the same part of these frequencies bands (or channels) allocated to each mobility area to be configured in all the GW gateways to which the mobility area corresponds. This is because the EP terminals that are supposed to be active in the same mobility area must be configured so as to communicate via frequency bands or channels allocated to this mobility area. If an EP terminal is configured with a frequency band or a channel that is not configured in a surrounding GW gateway able to receive the uplink frames sent by said terminal, then these uplink frames are not received by this GW gateway. Consequently a faulty configuration vis-à-vis the frequency plan unnecessarily increases the frame error rate.

It can also be envisaged dividing the frequency plan of a GW gateway into a plurality of hierarchies. For example, a quantity of channels could be allocated to a first mobility hierarchy and a quantity of other channels could be allocated to a second mobility hierarchy. It must be borne in mind that a faulty configuration could cause duplications of frequency bands, which would interfere with the establishment of these hierarchies in parallel.

Each range description comprises the following information: a range identifier, a list of the mobility areas contained in the radio coverage area associated with the range, and a list of GW gateways that must make it possible to implement said radio coverage area. When the communication system supports a plurality of mobility hierarchies in parallel, each range further comprises an identifier of the mobility hierarchy to which said range refers.

In a step 802, the LNS server 130 determines, from the mobility table obtained by executing the algorithm in FIG. 7 and the descriptions of ranges obtained at step 801, the list of frequency bands or channels allocated to each range. This list corresponds to the aggregation of the frequency bands or channels allocated to the mobility areas constituting the range in question. The LNS server 130 can update the range descriptions with the list of frequency bands respectively allocated to said ranges.

In a step 803, the LNS server 130 creates a frequency allocation table GWT-F for each GW gateway, from the descriptions of the ranges. Each range description gives the list of GW gateways to which the range in question relates, and the lists of frequency bands or channels allocated to each range then enable the LNS server 130 to define which frequency bands or channels must be supported by each GW gateway. Each frequency allocation table GWT-F then indicates a list of the frequency bands or channels in association with a range identifier from which said list of frequency bands or channels comes, and this for each range to which the GW gateway referred to by said frequency allocation table GWT-F relates. When the communication system supports a plurality of mobility hierarchies in parallel, each frequency allocation table GWT-F may further include the identifier of the mobility hierarchy to which each range refers.

In a step 830, the LNS server 130 configures each GW gateway so that said GW gate uses, for communicating by radio with EP terminals, the frequency bands or channels that have been allocated to it in accordance with the frequency-allocation table GWT-F associated with said GW gateway. Step 803 is for example performed by sending a message from the LNS server 130 to each of the GW gateways, using a JSON (JavaScript Object Notation) format. Each GW gateway is then configured accordingly.

FIG. 9 illustrates schematically an algorithm, implemented by the LNS server 130, for configuring EP terminals in order to apply the frequency plan as defined by execution of the algorithm in FIG. 7.

In a step 901, the LNS server 130 receives a JoinReq request for connection to the communication system from an EP terminal. This JoinReq request is relayed to the LNS server 130 by at least one GW gateway that received it directly from the EP terminal. To send this JoinReq request, the EP terminal uses a frequency band that is necessarily supported by every EP terminal and by every GW gateway when this EP terminal or GW gateway is intended to be used in the communication system. For example, according to the LoRaWAN technology, every EP terminal and every GW gateway must support three default frequency bands. The allocation of frequency bands or channels to which reference is made in FIGS. 6 to 8 relates to the frequency bands or channels other than those supported by default by every EP terminal and every GW gateway.

In a step 902, the LNS server 130 obtains a description of the EP terminal from which the LNS server 130 received the JoinReq request at step 901. The JoinReq request received at step 901 contains an identifier of the EP terminal. In a first embodiment, the SOE server 140 previously supplied to the LNS server 130 a description of each EP terminal able to connect to the communication system. In a second embodiment, the LNS server 130 obtains the identifier of the EP terminal from the JoinReq request received at step 901, and sends to the SOE server 140 a message containing said identifier in order to receive in response the description of the EP terminal in question. The description of each EP terminal contains a list of mobility types (MobilityType) and a quantity of frequency bands or channels to be allocated to the EP terminal in question by mobility type listed. The description may be supplemented with additional information, such as for example a quantity of repetitions NbRep that the EP terminal is supposed to make for each frame transmission, a maximum uplink rate, a minimum uplink rate, etc. When the communication system supports a plurality of mobility hierarchies in parallel, the description also contains the identifier of each mobility hierarchy vis-à-vis which said EP terminal must be configured. The description of the EP terminal as supplied by the SOE server 140 depends for example on a subscription actually taken out by a user of said EP terminal with the service operator.

In a step 903, the LNS server 130 identifies, from the description of the EP terminal obtained at step 902 (with the list of mobility types), the mobility type with the highest hierarchical degree to which said EP terminal has a right of access. When there exist a plurality of mobility types with the same hierarchical degree that can be identified by the LNS server 130 in a step 903, the LNS server 130 applies a predefined rule for selecting a mobility type among those with the same hierarchical degree that can be identified by the LNS server 130 in step 903.

In a step 904, the LNS server 130 identifies, from the mobility type identified at step 902 and from the mobility tree (instances of mobility types), the mobility areas with the highest hierarchical degree to which said EP terminal has a right of access.

In a step 905, the LNS server 130 checks whether at least one mobility area has been identified at step 904. If such is the case, a step 906 is performed; otherwise a step 909 is performed.

In step 906, the LNS server 130 selects a mobility area from the areas identified at step 904. Thus, when there exist a plurality of mobility areas with the same hierarchical degree that can be identified by the LNS server 130 in step 904, the LNS server 130 applies a predefined rule for selecting a mobility area from those with the same hierarchical degree identified by the LNS server 130 in step 904. For example, the LNS server 130 selects the mobility area that is included in a range description that has the largest quantity of GW gateways listed. According to another approach, the LNS server 130 selects the mobility area supported by the greatest quantity of GW gateways. The LNS server 130 can then make the request for this with the SOE server 140, supplying to it a list of areas identified at step 904. According to yet another approach, the LNS server 130 obtains, from each GW gateway that received and relayed the request referred to at step 901, information on the received signal level RSSI measured on reception of said request by said GW gateway. The LNS server 130 then determines an average of the received signal levels RSSI measured on reception of said request by the GW gateways of each mobility area in question, and the LNS server 130 selects the mobility area having the highest average of a received signal level RSSI measured on reception of said request.

In a step 907, the LNS server 130 selects, in accordance with a predefined rule, at least one frequency band or at least one channel allocated to the mobility area selected at step 906, by means of the mobility table. For example, the LNS server 130 randomly selects at least one frequency band or at least one channel allocated to the mobility area selected at step 906. Since each EP terminal can support only a predefined maximum quantity of frequency bands or channels, the LNS server 130 thus selects a quantity of frequency bands or channels in step 907, so that, in total, the quantity of frequency bands or channels selected for the EP terminal remains less than or equal to the predefined maximum quantity of frequency bands or channels that the EP terminal can support. For example, this predefined maximum quantity of frequency bands or channels that the EP channel can support is fixed at thirteen.

In a step 908, the LNS server 130 checks whether the predefined maximum quantity of frequency bands or channels that the EP terminal can support is reached. If such is the case, a step 911 is performed; otherwise step 909 is performed.

In step 909, the LNS server 130 checks whether at least one type of mobility area remains to be processed. If such is the case, a step 910 is performed; otherwise step 911 is performed.

In step 910, the LNS server 130 identifies which is the mobility type with the highest hierarchical degree to which said EP terminal has a right of access, excluding each mobility type previously processed in the context of the execution of the algorithm in FIG. 9 (previous iterations of steps 903 and 910 in the context of the current execution of the algorithm in FIG. 9). Next, step 904 is reiterated.

In step 911, the LNS server 130 configures the EP terminal so that said EP terminal uses, for communicating by radio in the communication system, the frequency bands or channels that were selected during the previous iterations of step 907 (in the context of the current execution of the algorithm in FIG. 9).

In a particular embodiment, in accordance with the message formats used in the LoRaWAN technology, the LNS server 130 configures the EP terminal in the following fashion. The LNS server 130 informs the EP terminal of a first lot of frequency bands or channels to be used, in a JoinAccept message in response to the JoinReq request received at step 901. The LNS server 130 uses a GW gateway as a relay for the JoinAccept message. Preferentially, in accordance with the message formats used in the LoRaWAN technology, up to five frequency bands or channels are thus indicated in the JoinAccept message. The LNS server 130 next informs the EP terminal of a second lot of frequency bands or channels to be used, in one or more supplementary NewChannelReq messages. Preferentially, in accordance with the message formats used in the LoRaWAN technology, a single frequency band or single channel is thus indicated in each supplementary NewChannelReq message. The LNS server 130 proceeds thus until said EP terminal is informed of all the frequency bands or channels that have been selected for said EP terminal during previous iterations of step 907 (in the context of the current execution of the algorithm in FIG. 9). The EP terminal then configures itself accordingly.

In another particular embodiment, the description of the EP terminal obtained at step 902 comprises information, supplied by the SOE server 140, indicating whether the EP terminal is supposed to be fixed (e.g. the EP terminal is a fixed sensor in a home-automation service). To make it possible to effectively locate a fixed EP terminal, the LNS server 130 must configure said EP terminal with frequency bands or channels supported by at least three GW gateways able to receive the uplink frames transmitted by said EP terminal. As explained previously, the LNS server 130 determines the list of frequency bands or channels eligible for said EP terminal. According to the GW gateways that relayed the JoinReq request to enable the LNS server 130 to receive said JoinReq request at step 901, the LNS server 130 determines the frequency bands or channels in this list that were allocated to at least three GW gateways among the GW gateways that relayed said JoinReq request. The LNS server 130 allocates these frequency bands or channels to said EP terminal. For the frequencies not selected, the LNS server 130 preferentially awaits receiving more uplink frames coming from said EP terminal in order to determine whether new GW gateways have received, and therefore relayed, said uplink frames. The LNS server 130 determines whether other frequency bands or channels in the list of frequency bands or channels eligible for said EP terminal have been allocated to at least three GW gateways among the GW gateways that relayed said uplink frames. Where the quantity of GW gateways receiving uplink frames coming from said EP terminal is still strictly less than three, the actual location of said EP terminal is not possible. The allocation of frequency bands or channels to said EP terminal then takes place, as previously described, without taking account of the need for location of the EP terminal. The LNS server 130 then sends an alert to the SOE server 140 in order to inform said SOE server 140, and therefore the service operator, that location is not possible for said EP terminal.

The invention claimed is:

1. A method, performed by a server, for defining and applying a frequency plan in a communication system of the LPWAN type comprising the server and a plurality of gateways connected to said server, the plurality of gateways using frequency bands for making wireless communications with terminals in the communication system, wherein the method comprises:
obtaining a description of a mobility hierarchy in which mobility types are hierarchically defined;
obtaining a description of a mobility tree in which mobility areas are hierarchically defined, each mobility area having a mobility type in conformity with the mobility hierarchy;
obtaining terrain measurements associated with each mobility area defined in the mobility tree;
determining, from the terrain measurements, for each mobility area, information on a percentage of time during which the terrain measurements show a received signal level RSSI lower than a received signal level RSSI threshold from a predefined set of received signal level RSSI thresholds;
in that the server runs through the mobility tree by iterating the following steps:
selecting the mobility area with the highest hierarchical degree not yet processed;
determining, for the mobility area selected, a mean probability $P_m$ for each frequency band, from said time-percentage information determined for each mobility area that is a leaf of the tree and is hierarchically attached to the mobility area selected;
allocating, for the mobility area selected, up to a quantity P of frequency bands having mean probabilities with the highest values among the mean probabilities $P_m$ for the frequency bands;
in that the server performs the following steps for configuring the gateways vis-à-vis the frequency plan:
obtaining descriptions of mobility ranges in which groupings of mobility areas are made and in which, for each grouping, a list of gateways is associated with each grouping in order to indicate which gateways are intended to support said grouping;
configuring each gateway according to said descriptions of ranges and frequency bands allocated to the mobility areas constituting said groupings;
in that, on reception from a terminal of a request for connection to the communication system, the server obtains a description of the terminal from a terminal identifier included in said request, the description including a list of mobility types to which said terminal has a right of access, and the server iterates the following steps for all the mobility types to which said terminal has a right of access:
identifying the mobility type with the highest hierarchical degree;
identifying which mobility areas correspond to said mobility type with the highest hierarchical degree identified;
selecting a mobility area from the mobility areas identified;
allocating to said terminal at least one frequency band allocated to the mobility area selected;
and wherein the server configures said terminal according to the frequency bands thus allocated to said terminal.

2. The method according to claim 1, wherein the mean probability $P_m$ is calculated as follows:

$$P_m = \frac{\sum_{k=1}^{N} \sum_{j=RSSI_d}^{RSSI_f} T_k(i,j)}{N*(RSSI_f - RSSI_d)}$$

where $RSSI_d$, is an index value corresponding to the minimum received signal level RSSI threshold value for which a probability value has been expressed vis-à-vis the mobility area in question, $RSSI_f$ is an index value corresponding to the maximum received signal level RSSI threshold value for which a probability value has been expressed vis-à-vis the mobility area in question, N is the quantity of mobility areas considered for calculating the mean probability $P_m$, and $T_k(i,j)$ represents the probability associated with the frequency band in question for the $k^{th}$ mobility area among said N mobility areas for a received signal level RSSI threshold represented by an index value j.

3. The method according to claim 1, wherein, to configure said terminal, the server performs the following steps:
informing a first lot of frequency bands allocated to the terminal, via a message responding to the request received; and
informing a second lot of frequency bands allocated to the terminal, via one or more supplementary messages.

4. The method according to claim 1, wherein channels form groupings of consecutive frequency bands, and the server allocates the frequency bands to a channel base.

5. The method according to claim 1, wherein the server obtains the description of the mobility hierarchy, the description of the mobility tree, the terrain measurements and the description of each terminal from another server external to the communication system.

6. The method according to claim 5, wherein the server checks that the mobility type of each mobility area of the mobility tree has a hierarchical degree lower than the mobility type of another mobility area to which said mobility area is directly attached in the mobility tree.

7. The method according to claim 1, wherein the description of each terminal comprises information indicating whether the terminal is supposed to be fixed, and the server performs the following steps vis-à-vis the terminal that sent the request received:
determining the list of frequency bands eligible for said terminal;
determining the frequency bands in this list that were allocated to at least three gateways among the gateways that relayed said request; and
allocating the frequency bands thus determined to said EP terminal.

8. The method according to claim 7, wherein, for the frequencies not selected in said list of eligible frequency bands, the server waits until it receives other frames coming from said terminal in order to determine whether new gateways have relayed said other frames and thus determine whether other frequency bands in said list of the eligible frequency bands have been allocated to at least three gateways among the gateways that relayed said other frames.

9. The method according to claim 8, wherein, in the case where the quantity of gateways receiving uplink frames coming from said terminal remains strictly less than three, the server sends an alert.

10. A computer program product embodied in a non-transitory computer readable medium containing a set of instructions causing the execution, by a processor of a server intended to be included in a long-range extended network of the LPWAN type, of the method according to claim 1, when said computer program is executed by said processor.

11. A non-transitory information storage medium storing a computer program containing a set of instructions causing the execution, by a processor of a server intended to be included in a long-range extended network of the LPWAN type, of the method according to claim 1, when said computer program is executed by said processor.

12. A server configured so as to define and apply a frequency plan in a communication system of the LPWAN type comprising, apart from said server, a plurality of gateways connected to said server, the plurality of gateways using frequency bands for effecting wireless communications with terminals in the communication system, wherein the server is configured to:
    obtain a description of a mobility hierarchy in which mobility types are hierarchically defined;
    obtain a description of a mobility tree in which mobility areas are hierarchically defined, each mobility area having a mobility type in conformity with the mobility hierarchy;
    obtain terrain measurements associated with each mobility area defined in the mobility tree;
    determine, from the terrain measurements, for each mobility area, information on a percentage of time during which the terrain measurements show a received signal level RSSI lower than a received signal level RSSI threshold from a predefined set of received signal level RSSI thresholds;
    wherein the server is configured so as to run though the mobility tree by iterating the following steps:
        selecting the mobility area with the highest hierarchical degree not yet processed;
        determining, for the mobility area selected, a mean probability $P_m$ for each frequency band, from said time-percentage information determined for each mobility area that is a leaf of the tree and is hierarchically attached to the mobility area selected;
        allocating, for the mobility area selected, up to a quantity P of frequency bands having mean probabilities with the highest values among the mean probabilities $P_m$ for the frequency bands;
    wherein the server is configured so as to perform the following steps for configuring the gateways vis-à-vis the frequency plan:
        obtaining descriptions of mobility ranges in which groupings of mobility areas are made and in which, for each grouping, a list of gateways is associated with each grouping in order to indicate which gateways are intended to support said grouping; and
        configuring each gateway according to said descriptions of ranges and frequency bands allocated to the mobility areas constituting said groupings;
    wherein, on reception from a terminal of a request for connection to the communication system, the server is configured to obtain a description of the terminal from a terminal identifier included in said request, the description including a list of mobility types to which said terminal has a right of access, and to iterate the following steps for all the mobility types to which said terminal has a right of access:
        identifying the mobility type with the highest hierarchical degree;
        identifying which mobility areas correspond to said mobility type with the highest hierarchical degree identified;
        selecting a mobility area from the mobility areas identified;
        allocating to said terminal at least one frequency band allocated to the mobility area selected; and
    wherein the server is configured to configure said terminal according to the frequency bands thus allocated to said terminal.

* * * * *